(12) United States Patent
Zhu et al.

(10) Patent No.: US 7,268,049 B2
(45) Date of Patent: Sep. 11, 2007

(54) STRUCTURE AND METHOD FOR MANUFACTURING MOSFET WITH SUPER-STEEP RETROGRADED ISLAND

(75) Inventors: Huilong Zhu, Poughkeepsie, NY (US); Effendi Leobandung, Wappingers Falls, NY (US); Anda C. Mocuta, Lagrangeville, NY (US); Dan M. Mocuta, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 10/954,838

(22) Filed: Sep. 30, 2004

(65) Prior Publication Data

US 2006/0068555 A1    Mar. 30, 2006

(51) Int. Cl.
*H01L 21/336* (2006.01)
(52) U.S. Cl. ...................... 438/300; 438/302
(58) Field of Classification Search ........... 438/300, 438/302
See application file for complete search history.

(56) References Cited

U.S. PATENT DOCUMENTS 6,621,131 B2  9/2003  Murthy et al.
2002/0109135 A1* 8/2002 Murota et al. ............... 257/20
2004/0072395 A1* 4/2004 Liu ............................ 438/197

OTHER PUBLICATIONS

M.G. Peters, et al., "Single electron tunneling and suppression of short-channel effetcs in submicron silicon transistors", *Journal of Applied Physics*, vol. 84, No. 9, pp. 5052-5056 (1998).

\* cited by examiner

*Primary Examiner*—B. William Baumeister
*Assistant Examiner*—Matthew L. Reames
(74) *Attorney, Agent, or Firm*—Scully, Scott, Murphy & Presser, P.C.; Todd M. C. Li, Esq.

(57) ABSTRACT

The present invention comprises a method for forming a semiconducting device including the steps of providing a layered structure including a substrate, a low diffusivity layer of a first-conductivity dopant; and a channel layer; forming a gate stack atop a protected surface of the channel layer; etching the layered structure selective to the gate stack to expose a surface of the substrate, where a remaining portion of the low diffusivity layer provides a retrograded island substantially aligned to the gate stack having a first dopant concentration to reduce short-channel effects without increasing leakage; growing a Si-containing material atop the recessed surface of the substrate; and doping the Si-containing material with a second-conductivity dopant at a second dopant concentration. The low diffusivity layer may be $Si_{1-x-y}Ge_xZ_y$, where Z can be carbon (C), xenon (Xe), germanium (Ge), krypton (Kr), argon (Ar), nitrogen (N), or combinations thereof.

7 Claims, 4 Drawing Sheets

STRUCTURE AND METHOD FOR MANUFACTURING MOSFET WITH SUPER-STEEP RETROGRADED ISLAND

FIELD OF THE INVENTION

The present invention relates to semiconductor devices and methods of manufacture, and more particularly to a method for manufacturing an improved metal oxide semiconductor (MOS) transistor having a steep retrograded dopant island.

BACKGROUND OF THE INVENTION

Field effect transistors (FETs) are the basic building block of today's integrated circuits (ICs). Such transistors can be formed in conventional bulk semiconductor substrates (such as silicon) or in an SOI layer of a silicon-on-insulator (SOI) substrate.

In order to be able to make ICs, such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device, while maintaining the device's electrical properties. Additionally, all dimensions of the device must be scaled simultaneously in order to optimize the devices' electrical performance.

The scaling of the physical processes breaks down when new phenomena, which are typically absent in the larger structures, dominate the devices behavior. For example, on decreasing the size of a MOSFET, at some point the channel length approaches the depletion layer widths of the source and drain. This results in a degradation of the subthreshold characteristics of the device and a failure to achieve current saturation, which ultimately reduces control of the gate. This phenomenon is called the "short-channel effect". Short-channel effects are well known to those skilled in the art as the decrease in threshold voltage, Vt, in short-channel devices, i.e., sub-0.1 µm due to two dimensional electrostatic charge sharing between the gate and the source/drain regions. One can suppress the short-channel effect by highly doping the channel, at the expense of reduced mobility, lower operating speed and increased risk for avalanches at the drain.

Prior attempts to improve short-channel effects include forming retrograded wells by implanting a high concentration of counter-dopant at the channel and source/drain extensions. The high concentration of counter-dopant at the PN junctions (source/channel interface, channel/drain interface) of the device disadvantageously result in increased device leakage.

In view of the state of the art mentioned above, it would be highly desirable to provide MOSFETS having gate lengths on the order of about 10 nm or less, which overcome the above-described disadvantages.

SUMMARY OF THE INVENTION

One object of the present invention is to provide a MOSFET device, and a method of forming thereof, having a steep retrograded dopant island, in which the steep retrograded dopant island is located underlying the device channel and effectively reduces the incidence of short-channel effects. It is another object of the present invention to provide a steep retrograded dopant island that is substantially aligned to the sidewalls of the overlying gate region. It is a further object of the present invention to integrate the steep retrograded dopant island with strained-Si device improvements. The term "steep retrograded dopant island" denotes a doped region underlying the device channel of a MOSFET, in which the edge of the dopant region is substantially aligned to the sidewalls of the overlying gate region.

These and other objects and advantages are achieved in the present invention by a method that reduces the diffusion of the steep retrograded island dopant, so that the dopant is contained beneath and substantially aligned with the sidewall of the gate region. More specifically, the present invention reduces the diffusion of the retrograded island dopant by reducing the formation of dislocations in the steep retrograded dopant island.

One aspect of the present invention relates to a method of forming a MOSFET having a steep retrograded dopant island, in which the retrograded dopant island is positioned substantially aligned with the gate region and has a dopant concentration to reduce the incidence of short-channel effects without increasing device leakage. Broadly, the method of the present invention comprises the steps of:

providing a layered structure comprising a substrate, a low diffusivity layer of a first conductivity type dopant atop said substrate, and a channel layer atop said low diffusivity layer of said first conductivity type dopant;

forming a gate region atop a protected surface of said channel layer of said layered structure;

etching said layered structure selective to said gate region to expose a surface of said substrate, where a remaining portion of said low diffusivity layer of said first conductivity type dopant provides a retrograded island substantially aligned with said gate region said retrograded dopant island having a first dopant concentration to reduce short-channel effects without increasing device leakage;

growing a Si-containing material atop said recessed surface of said substrate;

forming offset spacers abutting said gate region; and doping said Si-containing material with a second conductivity type dopant at a second dopant concentration.

The phrase "reduce short-channel effects without increasing device leakage" denotes that the present MOSFET comprising a steep retrograded dopant island has less than ⅓ the leakage of a conventional transistor, since the contact area between the steep retrograded dopant island and the source drain regions (i.e. source/drain extension regions and deep source/drain regions) is substantially minimized. Therefore, since the contact area between the steep retrograded dopant island and the source/drain regions is minimized, short-channel effects may be substantially reduced without incurring an increase in device leakage.

In accordance with the present method, the low diffusivity layer comprises $Si_{1-x-y}Ge_xZ_y$, wherein Z is a diffusion inhibiting dopant, x ranges from about 0.0 to about 0.2, and y ranges from about 0.001 to about 0.01. The first conductivity type dopant can be a p-type dopant and the second conductivity dopant can be an n-type dopant. Alternatively, the first conductivity type dopant can be an n-type dopant and the second conductivity dopant can be a p-type dopant. The diffusion inhibiting dopant may comprise carbon (C), xenon, (Xe) germanium (Ge), krypton (Kr), argon (Ar), nitrogen (N), or combinations thereof.

The layered structure may be etched by a directional etch process using the overlying gate region as an etch mask. The etch process continues through the exposed portions of the channel layer and the low diffusivity layer into the substrate until the upper surface of the substrate is recessed about 20 nm to about 100 nm from the substrate's original upper surface. Following etching, the remaining portion of the low diffusivity layer provides a steep retrograded island having sidewalls that are substantially aligned to the sidewall of the overlying gate region. The dopant concentration in the retrograded dopant island is sufficient to reduce the incidence of short-channel effects, yet does not increase device leakage. The presence of the diffusion inhibiting dopant within the retrograded dopant island ensures that the retrograded island dopant does not substantially diffuse beyond the sidewalls of the overlying gate region.

Following etching, a Si-containing material is then epitaxially formed atop the exposed surface of the substrate. Epitaxially growing SiGe atop the exposed surface of the substrate transfers a compressive stress to the channel layer, while epitaxially growing Si:C atop the exposed surface of the substrate transfers a tensile stress to the channel layer. The term "Si:C" denotes an epitaxially grown Si material that has been doped with C, wherein the concentration of carbon ranges from $1 \times 10^{19}$ atoms/cm$^3$ to $5 \times 10^{20}$ atoms/cm$^3$.

Another aspect of the present invention relates to a MOSFET device, produced by the above method, in which a steep retrograded dopant island reduces the incidence of the short-channel effects without increasing device leakage. In broad terms, the MOSFET comprises:

a gate region positioned on a channel portion of a substrate, said channel portion of said substrate positioned atop a first conductivity type retrograded dopant island and between a set of second conductivity type doped regions; and the first conductivity type retrograded dopant island substantially aligned to sidewalls of the gate region and having a first doping concentration sufficient to substantially reduce short-channel effects without increasing device leakage.

The channel portion of said substrate comprises a thickness ranging from about 10 nm to about 20 nm and a channel length of approximately 100 nm or less. The retrograded island has a doping concentration at least an order of magnitude greater than said channel region. The inventive MOSFET may further comprise deep source/drain regions, wherein the deep source/drain regions are separated from the first conductivity type retrograded dopant island by a leakage inhibiting dopant region. The leakage inhibiting dopant region may have a first conductivity type dopant in a concentration of at least one order of magnitude less than the first conductivity type retrograded dopant island.

Another aspect of the present invention is an integrated circuit comprising at least one semiconducting device comprising a gate region positioned on a channel portion of a substrate, said channel portion of said substrate positioned atop a first conductivity type retrograded dopant island and between a set of second conductivity type doped extension regions, said first conductivity type retrograded dopant island being substantially aligned to said gate region and having a doping concentration that substantially reduces short-channel effects within said at least one semiconducting device without increasing device leakage, and electrical contact to said at least one semiconducting device.

DETAILED DESCRIPTION

Figure 1:
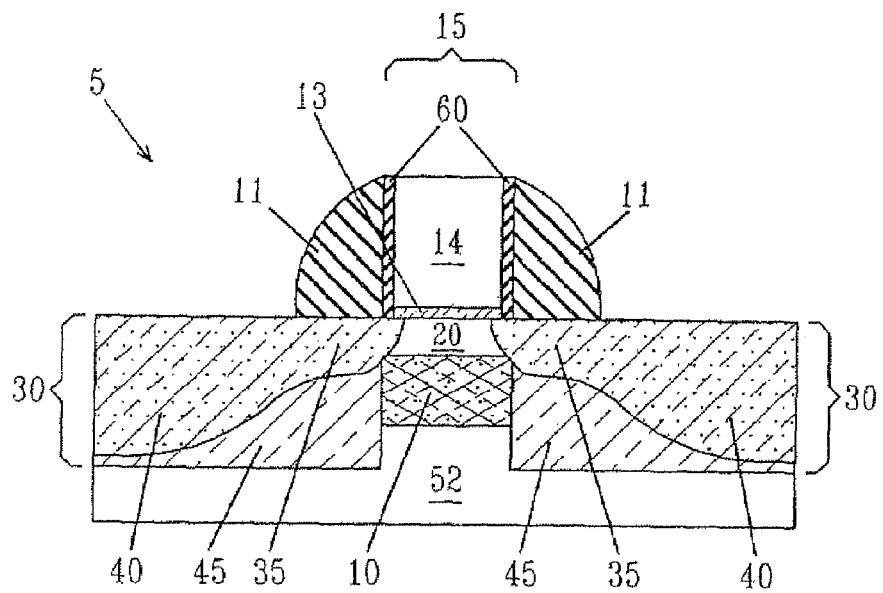
FIG. 1 is a pictorial representation (through a cross section view) of the inventive MOSFET device, in which a steep retrograded island reduces the incidence of short-channel effects without increasing device leakage.

The present invention, which is directed to a MOSFET having a steep retrograded dopant island that reduces short-channel effects without increasing device leakage, and a method of forming a MOSFET having a steep retrograded dopant island, will now be discussed in greater detail by referring to the drawings that accompany the present application. In the accompanying drawings, like and or corresponding elements are referred to by like reference numbers.

Referring to FIG. 1, illustrating one embodiment of the present invention, a MOSFET 5 is provided comprising a steep retrograded dopant island 10, in which the steep retrograded dopant island 10 is substantially aligned with the sidewalls of the overlying gate region 15. The gate region 15 includes a gate conductor 14, and a gate dielectric 13. Sidewall spacers 60 and offset spacers 11 are positioned adjacent to the gate region 15. The steep retrograded dopant island 10 comprises a first conductivity type dopant in a concentration that reduces the incidence of short-channel effects and is positioned within the device to ensure that the dopant concentration of the steep retrograded dopant island 10 does not substantially increase device leakage.

The steep retrograded dopant island 10 is positioned underlying the device channel 20, in which the device channel 20 has a first conductivity type dopant having a concentration at least one order of magnitude lower than the dopant concentration of the steep retrograded dopant island 10. The lower dopant concentration of the device channel 20 ensures that the charge carriers within the device channel 20 have a high mobility.

Regrown Si-containing regions 30 are positioned adjacent to the device channel 20 and the steep retrograded dopant island 10. The regrown Si-containing regions 30 comprise source/drain extensions 35 and deep source/drain regions 40 having a second conductivity type dopant. The source/drain extensions 35 abut the device channel 20. The deep source/drain regions 40 are separated from the steep retrograded dopant island 10 by a first conductivity type doped portion of the regrown Si-containing material having a doping concentration lower than the steep retrograded dopant island 10. The portion of the regrown Si-containing material separating the steep retrograded dopant island 10 from the deep source/drain regions 40 is hereafter referred to as a leakage inhibiting doped region 45.

When the first conductivity type dopant is an n-type dopant, such as arsenic or phosphorus, the second conductivity type dopant is a p-type dopant such as boron or indium. Conversely, if the first conductivity type dopant is a p-type dopant, the second conductivity type dopant is an n-type dopant.

In one embodiment of the present invention, the dopant concentration of the steep retrograded dopant island 10 ranges from about $5 \times 10^{18}$ atoms/cm$^3$ to about $2 \times 10^{20}$ atoms/cm$^3$, preferably being about $5 \times 10^{19}$ atoms/cm$^3$; the device channel 20 has a dopant concentration ranging from about $1 \times 10^{18}$ atoms/cm$^3$ to about $5 \times 10^{18}$ atoms/cm$^3$, preferably being about $3 \times 10^{18}$ atoms/cm$^3$; and the leakage inhibiting doped region 45 has a dopant concentration ranging from about $1\times10^{18}$ atoms/cm$^3$ to about $1\times10^{19}$ atoms/cm$^3$, preferably being about $5\times10^{18}$ atoms/cm$^3$. The source/drain extension regions 35 may have a dopant concentration ranging from about $5\times10^{19}$ atoms/cm$^3$ to about $5\times10^{20}$ atoms/cm$^3$, preferably being about $2\times10^{20}$ atoms/cm$^3$; and the deep source/drain regions 40 may have a dopant concentration ranging from about $1\times10^{20}$ atoms/cm$^3$ to about $5\times10^{20}$ atoms/cm$^3$, preferably being about $3\times10^{20}$ atoms/cm$^3$. The method of forming the MOSFET depicted in FIG. 1 is now described in FIGS. 2-7.

Figure 2:
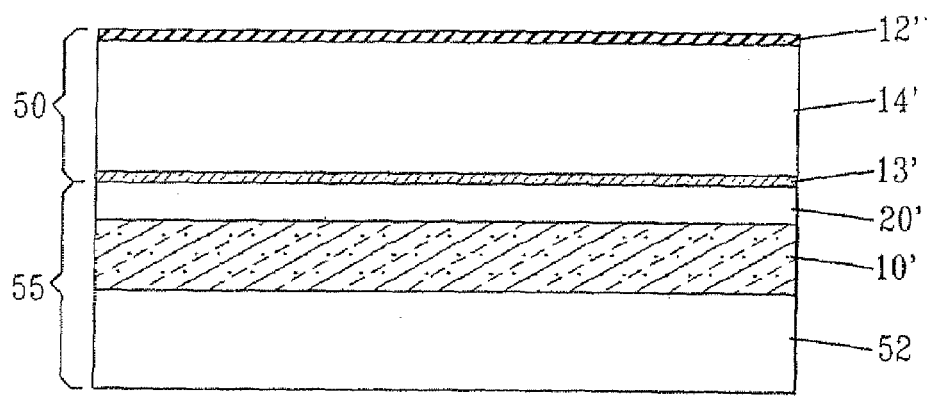
FIGS. 2-7 are pictorial representations (through a cross section view) of the present invention.

Reference is first made to FIG. 2, which illustrates an initial structure that can be employed in the present invention including a gate stack 50 atop a layered structure 55. Specifically, the layered structure 55 comprises a channel layer 20' atop a low diffusivity layer of a first conductivity type dopant 10', wherein the low diffusivity layer of a first conductivity type dopant 10' is positioned on a substrate 52.

The substrate 52 includes, but is not limited to: any semiconducting material such conventional Si-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), annealed poly Si, and poly Si line structures.

Still referring to FIG. 2, the low diffusivity layer of first conductivity type dopant 10' is formed atop the substrate 52 by epitaxial growth or like processes. The first conductivity type dopant may be a p-type or n-type dopant present in a concentration ranging from about $1\times10^{19}$ atoms/cm$^3$ to about $1\times10^{20}$ atoms/cm$^3$. The low diffusivity layer of first conductivity type dopant 10' may be doped during epitaxial growth or it may be doped by ion implantation following growth.

In one embodiment of the present invention, the epitaxially grown low diffusivity layer of first conductivity type dopant 10' has the composition $Si_{1-x-y}Ge_xZ_y$, wherein Z is a diffusion inhibiting dopant, x ranges from about 0.0 to about 0.2, and y ranges from about 0.001 to about 0.01. The Ge concentration of the low diffusivity layer of first conductivity type dopant 10' is selected to produce an internal stress within the low diffusivity layer of first conductivity type dopant 10'. The internal stress is produced by depositing a material layer (such as the low diffusivity layer of first conductivity type dopant 10') having a different energetically favorable lattice dimension than the surface on which the material layer is grown (substrate 52), since the lattice dimension of the material layer is strained to match the lattice dimension of the surface on which the material layer is grown. The greater the Ge concentration within the low diffusivity layer of first conductivity type dopant 10', the greater the differential between the lattice dimensions of the low diffusivity layer of first conductivity type dopant 10' and the substrate 52. The epitaxially grown low diffusivity layer of first conductivity type dopant 10' may function as an etch stop during subsequent processing.

The strain produced in the low diffusivity layer of first conductivity type dopant 10' is maintained so long as the low diffusivity layer of first conductivity type dopant 10' is not grown to a thickness greater than its critical thickness. If the material layer is grown to a thickness greater than its critical thickness, the material layer will grow having its energetically favorable lattice dimension that differs from the lattice dimension of the surface on which the material layer is grown and will relax via dislocation formation. Typically, the low diffusivity layer of first conductivity type dopant 10' can be grown to a thickness ranging from about 10 nm to about 50 nm.

The diffusion inhibiting dopant can comprise carbon (C), xenon (Xe), germanium (Ge), krypton (Kr), argon (Ar), nitrogen (N), or combinations thereof. When producing n-type MOSFETs, the diffusion inhibiting dopant of the low diffusivity layer of first conductivity type dopant 10' is preferably carbon present in an concentration from about $1\times10^{19}$ atoms/cm$^3$ to about $5\times10^{20}$ atoms/cm$^3$. When producing p-type MOSFETs, the diffusion inhibiting dopant of the low diffusivity layer of first conductivity type dopant 10' is preferably xenon present in a concentration from about $1\times10^{19}$ atoms/cm$^3$ to about $5\times10^{20}$ atoms/cm$^3$.

In another embodiment of the present invention, the low diffusivity layer of first conductivity type dopant 10' may be formed by epitaxially growing strained $Si_{1-x}Ge_x$ (x ranges from about 0.0 to about 0.2) and then ion implanting the diffusion inhibiting dopant. In this embodiment, ion implantation of the diffusion inhibiting dopant is followed by a thermal anneal process step to remove implant damage.

The channel layer 20' is epitaxially grown atop the low diffusivity layer of first conductivity type dopant 10'. The channel layer 20' comprises a Si-containing material and has a thickness ranging from about 10 nm to about 20 nm. The channel layer 20' can be doped with a first conductivity type dopant during epitaxial growth or via ion implantation. The dopant concentration o the channel layer 20' preferably ranges from $1\times10^{17}$ atoms/cm$^3$ to about $5\times10^{18}$ atoms/cm$^3$.

Still referring to FIG. 2, a gate stack 50 is formed atop the layered structure 55 using conventional forming processes. The gate stack 50 comprises a gate dielectric layer 13', a gate conductor layer 14', and a gate cap layer 12'.

The gate dielectric layer 13' may be composed of a nitride, oxynitride, or a combination thereof. The gate dielectric layer is formed using deposition techniques, such as chemical vapor deposition (CVD), atomic layer CVD (ALCVD), pulsed CVD, plasma assisted CVD, sputtering, and chemical solution deposition, or by a thermal growing process, such as oxidation, oxynitridation, nitridation, and/or plasma or radical treatment. Suitable examples of oxides that can be employed as the gate dielectric layer include, but are not limited to: $SiO_2$, $Al_2O_3$, $ZrO_2$, $HfO_2$, $Ta_2O_3$, $TiO_2$, perovskite-type oxides and combinations and multi-layers thereof. The gate dielectric layer 13' preferably has a thickness ranging from about 0.5 nm to about 3.0 nm, preferably being less than 1.0 nm. The gate dielectric layer 13' is subsequently etched to form the gate dielectric.

After gate dielectric layer 13' has been formed, the gate conductor layer 14' is formed atop the gate dielectric layer 13' by a deposition process (such as CVD, plasma-assisted CVD, plating, sputtering and etc.) Gate conductor layer 14' may comprise any conductive material including, but not limited to: polysilicon; a conductive elemental metal such as W, Cu, Pt, Ag, Au, Ru, Ir, Rh, and Re; alloys that include at least one of the aforementioned conductive elemental metals; silicides or nitrides that include at least one of the above-mentioned conductive elemental metals; and combinations thereof may be employed. Examples of silicides that may be utilized in the gate conductor layer 14' include $CoSi_2$ and NiSi. Examples of nitrides that may be utilized in the gate conductor layer 14' includes TiN, WN, and TaN.

A highly preferred conductive material employed in the gate conductor layer 14' is polysilicon doped with first or second conductivity type dopants. When a polysilicon gate conductor is employed, the polysilicon gate conductor is formed by deposition, ion implantation and annealing. The dopant may also be introduced during deposition of the gate conductor layer 14'.

Still referring to FIG. 2, the gate cap layer 12' is optionally formed atop the gate conductor layer 14'. In a preferred embodiment of the present invention, gate cap layer 12' may be a nitride or oxynitride, with $Si_3N_4$ being highly preferred. The gate cap layer 12' can be deposited using a conventional deposition process including, but not limited to: chemical vapor deposition, room temperature chemical vapor deposition, or plasma enhanced chemical vapor deposition. The thickness of the gate cap layer 12' may range from about 10.0 nm to about 100.0 nm.

Figure 3:
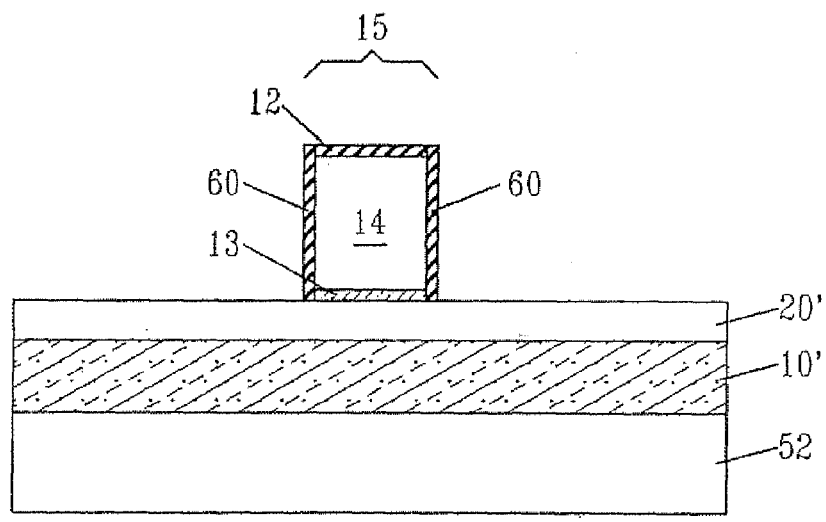

Referring to FIG. 3, the gate stack 50 is then patterned and etched to form a gate region 15 using deposition, photolithography, and etching. Specifically, a pattern is produced by applying a photoresist to the surface to be patterned; exposing the photoresist to a pattern of radiation; and then developing the pattern into the photoresist utilizing a conventional resist developer. Once the patterning of the photoresist is completed, the sections covered by the photoresist are protected, while the exposed regions are removed using a selective etching process that removes the unprotected regions of the gate stack 50. Preferably, this etch process has a high selectivity for removing the material of the gate cap layer 12', the gate conductor layer 14' and the gate dielectric layer 13' without substantially etching the patterned photoresist and the channel layer 20' of the stacked structure 55. Following etching, the patterned photoresist is removed using a chemical strip. The resultant gate region 15 includes a gate cap 12 atop a gate conductor 14, wherein the gate conductor 14 is positioned atop a gate dielectric 13.

In a next process step, thin sidewall spacers 60 are formed abutting the gate region 15. Preferably, the thin sidewall spacer 60 is a nitride, such as $Si_3N_4$. The thin sidewall spacer width ranges from about 1 nm to about 20 nm, preferably being about 3 nm. Forming processes such as deposition or thermal growing may produce the thin sidewall spacer 60. Preferably, the thin sidewall spacer 60 is formed by a deposition process such as, for example, chemical vapor deposition (CVD), low-pressure chemical vapor deposition (LPCVD), rapid thermal chemical vapor deposition (RTCVD), or plasma enhanced chemical vapor deposition (PECVD) in combination with a directional reactive ion etch.

Figure 4:
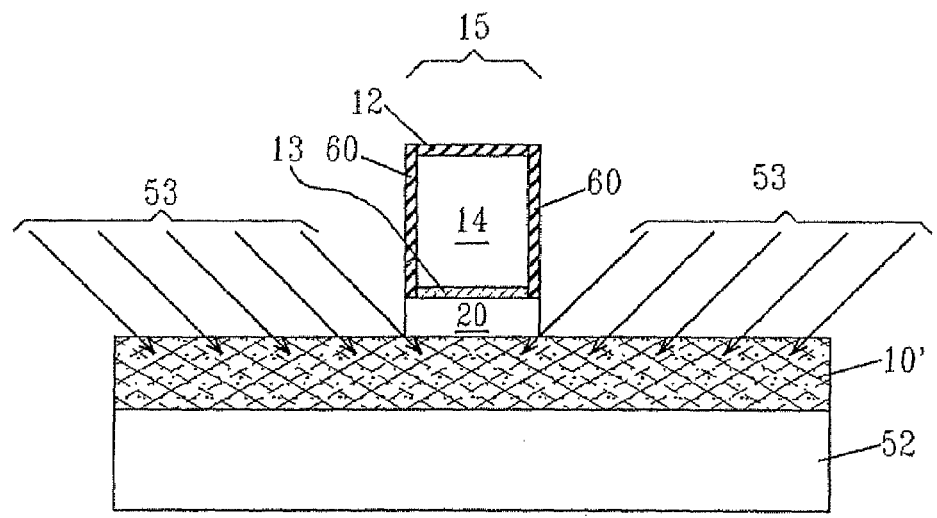

Referring to FIG. 4, in a next process step the device channel 20 is formed by a directional etch process, such as reactive ion etch (RIE), in which the overlying gate region 15 functions as an etch mask. In a preferred embodiment, the directional etch process is selective to removing the exposed portions of the device channel layer 20 without substantially etching the gate cap 12 or the low diffusivity layer of first conductivity dopant 10'.

In one embodiment of the present invention and following device channel 20 etching, the low diffusivity layer of a first conductivity dopant 10' can be doped by an angled ion implantation 53 to provide a non-uniform lateral doping profile underlying the device channel. The angled ion implantation 53 may be referred to a halo implantation. NFET devices are typically implanted with a p-type halo implant and pFET devices are typically implanted with an n-type halo implant.

Figure 5:
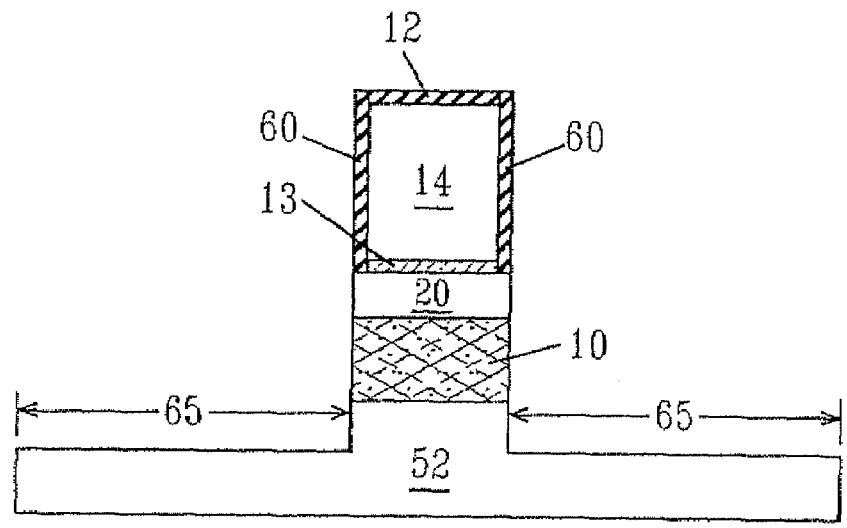

Referring to FIG. 5, in a next process step the exposed portion of the low diffusivity layer of a first conductivity type dopant and a portion of the substrate 52 are etched by a timed directional etch. The remaining portion of the low diffusivity layer of first conductivity type dopant provides a steep retrograded dopant island 10 having sidewalls that are substantially aligned with the sidewalls of the overlying gate region 15. The etch process is timed to expose a recessed surface 65 of the substrate 52. The substrate surface 65 is recessed to avoid positioning defects that are formed during subsequent epitaxial growth of the regrown Si-containing material atop the recessed surface 65 of the substrate 52 too close to the interface of the subsequently formed deep source/drain regions and the channel 20. Typically, the recessed surface 65 of the substrate 52 is recessed about 20 nm to about 30 nm from the original upper surface of the substrate 52 for a silicon-on-insulator (SOI) substrate device and about 100 nm to about 300 nm from the original upper surface of the substrate 52 for a bulk Si-containing substrate device.

Following etch, the gate cap 12 may be removed from the surface of the gate conductor 14.

Figure 6:
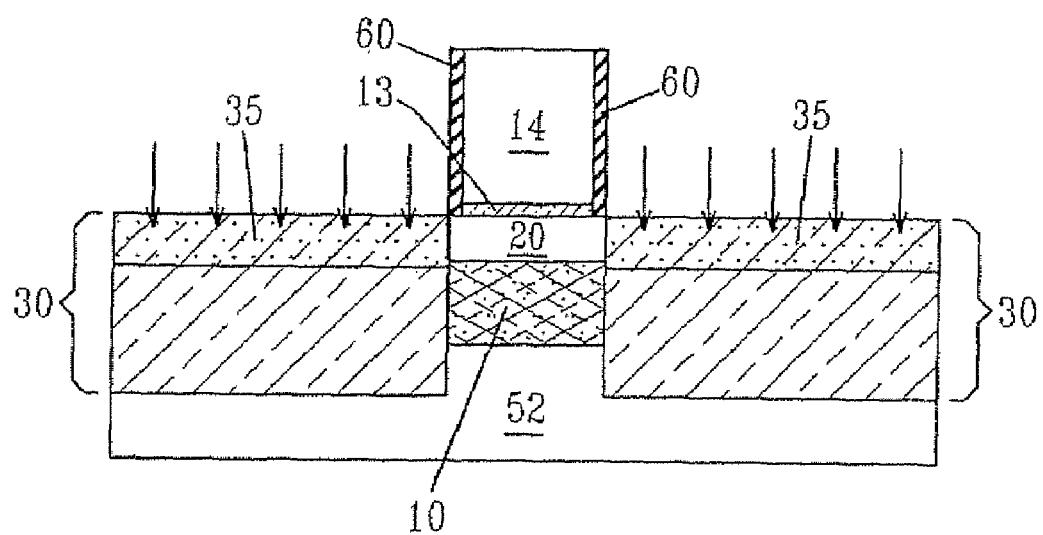

Referring to FIG. 6, a regrown Si-containing material 30 is then epitaxially formed atop the recessed surface 65 of the substrate 52. The regrown Si-containing material 30 may comprise Si, SiGe, or Si:C (silicon doped with carbon).

In one embodiment of the present invention, the regrown Si-containing material 30 transfers a compressive stress into the device channel 20 that increases device performance in p-type MOSFETS. In this embodiment, the regrown Si-containing material 30 comprises epitaxially grown SiGe. The Ge concentration in this embodiment may range from about 5% to about 30%.

Epitaxially growing the larger lattice dimension SiGe atop the smaller lattice dimension of the substrate 52 creates an internal compressive stress. The SiGe regrown Si-containing material 30 transfers the internal compressive stress into the device channel 20. Therefore, the device channel 20 is strained to provide strained-Si device improvements for p-type MOSFET devices, in which the compressive strain transferred from the regrown Si-containing material 30 increases the carrier mobility for p-type channels.

In another embodiment of the present invention, the regrown Si-containing material 30 transfers a tensile stress into the device channel 20 that increases device performance in n-type MOSFETS. In this embodiment, the regrown Si-containing material 30 comprises epitaxially grown Si:C, in which increasing the C concentration of the regrown Si-containing material 30 decrease the energetically favorable lattice dimension of the regrown Si-containing material 30. The C concentration in this embodiment may range from about 0.1% to about 2%.

Epitaxially growing the smaller lattice dimension Si:C atop the larger lattice dimension of the substrate creates an internal tensile stress. The Si:C regrown Si-containing material 30 transfers the internal tensile stress into the device channel 20. Therefore, the device channel 20 is strained to provide strained-Si device improvements for n-type MOSFET devices, in which the tensile strain transferred from the regrown Si-containing material 30 increases the carrier mobility for n-type channels.

Still referring to FIG. 6, source/drain extension regions 35 are then formed in regrown Si-containing material 30 and partially extend under the gate region 15. Source/drain extension regions 35 are formed via ion implantation and comprise a combination of normally incident and angled implants of second conductivity type dopants to form the desired grading in the extensions. P-type MOSFET devices are produced by doping the source/drain extension regions 35 with elements from group III of the Periodic Table of Elements. N-type MOSFET devices are produced within Si-containing substrates by doping the source/drain extension regions 7 with elements from group V of the Periodic Table of Elements.

When the first conductivity type dopant utilized in the device channel 20 and the steep retrograded dopant island 10 is a p-type dopant, the second conductivity type dopant used in the source/drain extension regions 35 is an n-type dopant. When the first conductivity type dopant utilized in the device channel 20 and the steep retrograded dopant island 10 is an n-type dopant, the second conductivity type dopant used in the source/drain extension regions 35 is a p-type dopant.

Halo regions may also be formed beneath the source/drain extension regions 35 using an angled ion implantation and a dopant having a conductivity type opposite the source/drain extension regions 35.

Figure 7:
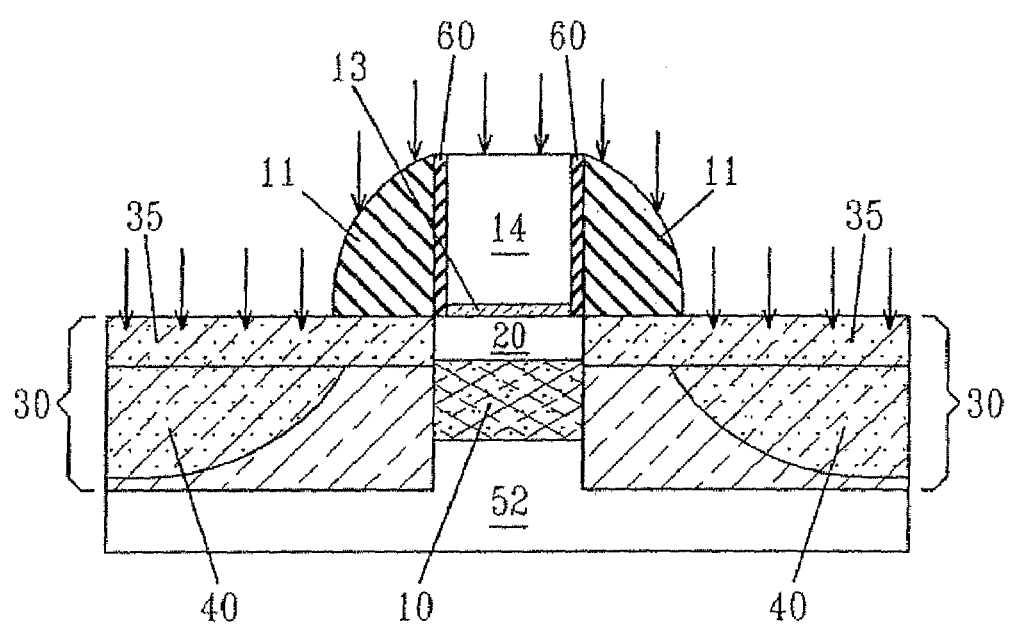

Referring to FIG. 7, following source/drain extension region 35 implants, an offset spacer 11 is formed abutting the sidewall spacer 60. The offset spacer 11 is formed using conventional deposition and etching processes that are well known in the art and preferably comprises a nitride, such as $Si_3N_4$. The offset spacer 11 has a greater width than the sidewall spacer 60. The offset spacer 11 width ranges from about 10 nm to about 200 nm.

Following offset spacer 11 formation, a higher energy ion implant of a second conductivity type dopant is conducted to form deep source/drain regions 40. These implants are conducted at a higher energy and higher concentration of second conductivity type dopant than the source/drain extension region 35 implant. The dopant concentration of the deep source/drain regions 40 ranges from about $1 \times 10^{20}$ atoms/$cm^3$ to about $5 \times 10^{20}$ atoms/$cm^3$. The deep source/drain regions 40 are typically doped with a dopant type consistent with the source/drain extension regions 35. For example, p-type source/drain regions 40 are typically doped with boron at a concentration of about $1 \times 10^{15}$ atoms/$cm^3$ to about $5 \times 10^{15}$ atoms/$cm^3$ and implant energy of about 1 keV to about 10 keV. N-type source/drain regions 40 are typically doped with arsenic at a concentration of about $1 \times 10^{15}$ atoms/$cm^3$ to about $5 \times 10^{20}$ atoms/$cm^3$ and implant energy of about 5 keV to about 40 keV.

The width of the offset spacer 11 and the energy of the implant to form the deep source/drain regions 40 ensure that the deep source/drain regions 40 are separated from the steep retrograded dopant island 10 by a leakage inhibiting doped region 45 of a first conductivity type dopant and a dopant concentration ranging from about $1 \times 10^{18}$ atoms/$cm^3$ to about $1 \times 10^{20}$ atoms/$cm^3$.

Following deep source/drain region 40 formation, the deep source/drain regions 40 and gate region 15 are activated by activation annealing using conventional processes such as, but not limited to: rapid thermal annealing, furnace annealing, flash lamp annealing or laser annealing. Activation anneal is conducted at a temperature ranging from about 850° C. to about 1350° C.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of forming a semiconducting device comprising:
    providing a layered structure comprising a substrate, a low diffusivity layer of a first conductivity type dopant atop said substrate, and a channel layer atop said low diffusivity layer of said first conductivity type dopant, wherein said low diffusivity layer of said first conductivity type dopant comprises $Si_{1-x-y}Ge_y$, in which Z is a diffusion inhibiting dopant selected from the group consisting of carbon, xenon, krypton. argon, nitrogen, and combinations thereof;
    forming a gate region atop a protected surface of said channel layer of said layered structure;
    etching said layered structure selective to said gate region to expose a surface of said substrate, where a remaining portion of said low diffusivity layer of said first conductivity type dopant provides a retrograded island substantially aligned with said gate stack having a first dopant concentration to reduce short-channel effects without increasing device leakage;
    growing a Si-containing material atop said recessed surface of said substrate;
    forming offset spacers abutting said gate region; and
    doping said Si-containing material with a second conductivity type dopant at a second dopant concentration.

2. The method of claim 1 wherein said first conductivity type dopant is an n-type dopant and said second conductivity type dopant is a p-type dopant.

3. The method of claim 1 wherein said first conductivity type dopant is a p-type dopant and said second conductivity type dopant is an n-type dopant.

4. The method of claim 1 wherein said low diffusivity layer of said first conductivity type dopant is formed by epitaxially growing SiGe to a thickness ranging from about 10 nm to about 50 nm atop said substrate; doping said diffusion inhibiting dopant at a concentration ranging from about $1 \times 10^{18}$ atoms/$cm^3$ to about $1 \times 10^{20}$ atoms/$cm^3$; and doping said first conductivity dopant at a concentration ranging from about $5 \times 10^{18}$ atoms/$cm^3$ to $1 \times 10^{20}$ atoms/$cm^3$.

5. The method of claim 1 wherein said second dopant concentration is greater than said first dopant concentration.

6. The method of claim 2 wherein said growing said Si-containing material atop said exposed surface of said substrate comprises epitaxially growing SiGe, wherein said Si-containing material transfers a compressive stress to said channel layer.

7. The method of claim 3 wherein said growing said Si-containing material atop said exposed surface of said substrate comprises epitaxially growing Si:C, wherein said Si-containing material transfers a tensile stress to said channel layer.

* * * * *